US008149034B2

(12) United States Patent
Gomm

(10) Patent No.: US 8,149,034 B2
(45) Date of Patent: Apr. 3, 2012

(54) DELAY LINES, METHODS FOR DELAYING A SIGNAL, AND DELAY LOCK LOOPS

(75) Inventor: Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/986,973

(22) Filed: Jan. 7, 2011

(65) Prior Publication Data

US 2011/0102029 A1 May 5, 2011

Related U.S. Application Data

(62) Division of application No. 12/356,916, filed on Jan. 21, 2009, now Pat. No. 7,872,507.

(51) Int. Cl.
*H03L 7/06* (2006.01)

(52) U.S. Cl. ........................................ 327/158; 327/147

(58) Field of Classification Search .................. 327/149, 327/158
See application file for complete search history.

(56) References Cited

U.S. PATENT DOCUMENTS

| | | | | |
|---|---|---|---|---|
| 5,428,309 | A * | 6/1995 | Yamauchi et al. | 327/158 |
| 5,712,583 | A * | 1/1998 | Frankeny | 327/158 |
| 6,768,361 | B2 * | 7/2004 | Kwak | 327/158 |
| 7,088,159 | B2 * | 8/2006 | Kwak et al. | 327/161 |
| 7,202,721 | B2 * | 4/2007 | Jeon | 327/158 |
| 7,242,232 | B2 * | 7/2007 | Kim et al. | 327/158 |
| 7,274,236 | B2 * | 9/2007 | Lee | 327/261 |
| 7,282,974 | B2 * | 10/2007 | Lee | 327/158 |
| 7,339,408 | B2 * | 3/2008 | Lee | 327/158 |
| 7,385,428 | B2 * | 6/2008 | Lee et al. | 327/149 |
| 7,554,375 | B2 * | 6/2009 | Kwak | 327/278 |
| 7,570,191 | B2 * | 8/2009 | Easwaran et al. | 341/161 |
| 7,573,308 | B2 * | 8/2009 | Kim | 327/158 |
| 7,598,783 | B2 * | 10/2009 | Shin et al. | 327/158 |
| 7,629,819 | B2 * | 12/2009 | Kwak et al. | 327/158 |
| 7,688,124 | B2 * | 3/2010 | Choi | 327/158 |
| 7,701,272 | B2 * | 4/2010 | Ma | 327/158 |
| 2004/0155686 | A1 * | 8/2004 | Kim et al. | 327/158 |
| 2004/0201406 | A1 * | 10/2004 | Lee et al. | 327/158 |
| 2005/0285643 | A1 * | 12/2005 | Lee | 327/158 |
| 2006/0001463 | A1 * | 1/2006 | Lee et al. | 327/147 |
| 2007/0030753 | A1 * | 2/2007 | Kwak | 365/233 |
| 2007/0115036 | A1 * | 5/2007 | Lee | 327/158 |
| 2008/0012615 | A1 * | 1/2008 | Park | 327/158 |
| 2008/0100356 | A1 * | 5/2008 | Lee | 327/158 |
| 2008/0297215 | A1 * | 12/2008 | Ma | 327/158 |

(Continued)

*Primary Examiner* — Lincoln Donovan
*Assistant Examiner* — Adam Houston
(74) *Attorney, Agent, or Firm* — Dorsey & Whitney LLP

(57) ABSTRACT

Locked loops, delay lines and methods for delaying signals are disclosed, such as a delay line and delay lock loop using the delay line includes a series of delay stages, each of which consists of a single inverting delay device. The inputs and outputs of a selected stage are applied to a phase inverter that inverts one of the signals and applies it to a first input of a phase mixer with the same delay that the other signal is applied to a second input of the phase inverter. The delay of the signals from the selected delay element are delayed from each other by a coarse delay interval, and the phase mixer interpolates within the coarse delay interval by fine delay intervals. A phase detector compares the timing of a signal generated by the phase interpolator to the timing of a reference clock signal applied to the delay line to determine the selected delay stage and a phase interpolation value.

20 Claims, 2 Drawing Sheets

U.S. PATENT DOCUMENTS

2009/0179676 A1* 7/2009 Gomm et al. ................. 327/158
2009/0322390 A1* 12/2009 Shim ............................ 327/158
2010/0060335 A1* 3/2010 Kwak et al. .................. 327/158
2010/0090736 A1* 4/2010 Kim et al. .................... 327/158

* cited by examiner

DELAY LINES, METHODS FOR DELAYING A SIGNAL, AND DELAY LOCK LOOPS

CROSS-REFERENCE TO RELATED APPLICATION

This application is a divisional of U.S. patent application Ser. No. 12/356,916, filed Jan. 21, 2009. This application is incorporated by reference herein in its entirety and for all purposes.

TECHNICAL FIELD

This invention relates to delay lines and delay lock loops using delay lines, and, more particularly, in one or more embodiments, to a delay line providing improved linearity and duty cycle symmetry.

BACKGROUND OF THE INVENTION

A variety of circuits are included in integrated circuits, such as memory devices. One such circuit is a delay lock loop ("DLL"), a typical example of which is shown in FIG. 1. The DLL 10 includes a delay line 14, which, as explained in greater detail below, includes a large number of gates coupled to each other in series. The delay line 14 receives a reference clock signal $CLK_{REF}$ and generates an output clock signal $CLK_{OUT}$ having a delay relative to the reference clock signal $CLK_{REF}$ that is controlled by a delay control signal DelCtrl. The delay control signal DelCtrl adjusts the delay provided by the delay line 14 by altering the number of gates through which the $CLK_{REF}$ is coupled. The DLL 10 also includes a phase detector 16 and delay controller 18 coupled to outputs of the phase detector 16 for adjusting the delay of the delay line 14. The phase detector 16 compares the phase of the reference clock signal $CLK_{REF}$ to the phase of an output clock signal $CLK_{OUT}$ generated by delay line 14 to determine a phase error. The $CLK_{OUT}$ signal is thus used as a feedback clock signal, although other signals derived from the $CLK_{OUT}$ signal may instead be used as the feedback clock signal. The feedback clock signal is coupled to the input of phase detector though a model delay circuit 20. The model delay circuit 20 delays the feedback clock signal by substantially the sum of the input delay of the $CLK_{REF}$ signal being coupled to the phase detector 16 and the output delay of the $CLK_{OUT}$ signal being coupled from the delay line 14. As a result, the phase of the $CLK_{OUT}$ signal is accurately synchronized to the phase of the $CLK_{REF}$ signal. If the phase detector 16 is a digital phase detector, it typically generates an UP signal if the $CLK_{OUT}$ signal leads the $CLK_{REF}$ signal by more than a first phase error. The delay controller 18 responds to the UP signal by increasing the delay of the delay line 14 to reduce the phase error. Similarly, the phase detector 16 generates a DN signal if the $CLK_{OUT}$ signal lags the $CLK_{REF}$ signal by more than a second phase error. In that case, the delay controller 18 responds to the DN signal by decreasing the delay of the delay line 14 to again reduce the phase error. The phase detector 16 generates neither an UP signal nor a DN signal if the magnitude of the phase error is between the first phase error and the second phase error.

The DLL 10 can be used for a variety of functions in a memory device and in other integrated circuit devices. For example, the DLL 10 can be used in a memory device to perform such functions as synchronizing one signal, such as a data strobe signal DQS, to another signal, such as an external clock signal as long as a delay in coupling the external clock signal to the DLL10 and a delay in coupling the DQS signal from the DLL10 are compensated for by corresponding model delays in the feedback path of the DLL 10. The DQS signal can then be used to latch data at a time that is synchronized with the external clock signal.

The degree to which the DLL10 is able to lock the phase of the $CLK_{OUT}$ signal to the phase of the $CLK_{REF}$ signal is largely determined by the delay adjustability of the delay line 14. If the delay of the delay line 14 can only be adjusted in relatively coarse steps, the error between the phase of the $CLK_{OUT}$ signal and the phase of the $CLK_{REF}$ signal can be relatively large. For this reason, it is desirable for the delay line 14 to have a large number of gates or other delay devices. A large number of gates or other delay devices allows the delay of the delay line to be adjusted in a larger number of steps. For example, if the delay line 14 has 72 delay stages, the delay line 14 can adjust the delay of the delay line in approximately 5 degree steps (i.e., (360° minus delay of model delay circuits)/72). Although a large number of gates or other delay devices provides a great deal of delay adjustability, it can also result in a large power consumption.

In order to allow the delay of a delay line to be adjusted in relatively fine steps to provide high accuracy without consuming a significant amount of power, a phase mixer (not shown) can be used to interpolate between relatively coarse steps. Using a phase mixer, the $CLK_{OUT}$ signal is delayed relative to the $CLK_{REF}$ signal by the sum of the coarse steps provided by the delay line and fine steps provided by the phase mixer. Significantly, the minimum step size is then the size of a fine step.

Unfortunately, conventional DLLs using a combination of a delay line and a phase mixer to delay the $CLK_{OUT}$ signal relative to the $CLK_{REF}$ signal can suffer a number of performance limitations, primarily because the delay lines typically used have two inverting gates in each of a plurality of delay stages. As a result, the phase mixer must interpolate over a larger range in order to provide a given size of the fine step. Additionally, phase mixers interpolating over a large range often exhibit excessive non-linearity because the non-linearity of a phase mixer is normally a fixed percentage of the range over which the phase mixer interpolates. Thus, the larger coarse step provided by two inverting gates can result in an undesirable degree of non-linearity.

There is therefore a need for a delay line that provides good duty cycle symmetry, and that allows a phase mixer to interpolate over a relatively small range and provide good phase mixer linearity.

DETAILED DESCRIPTION

Figure 1:
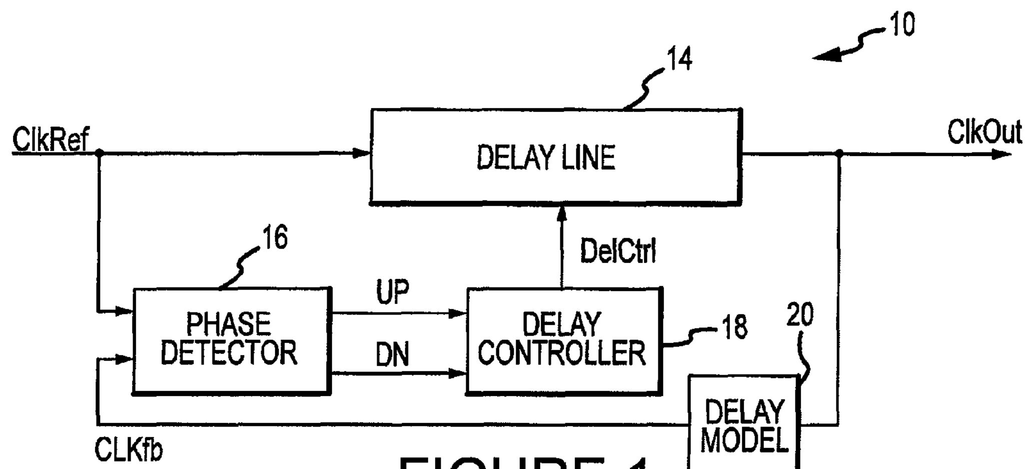
FIG. 1 is a block diagram of a conventional delay lock loop using a delay line to delay a reference clock signal.
Figure 2:
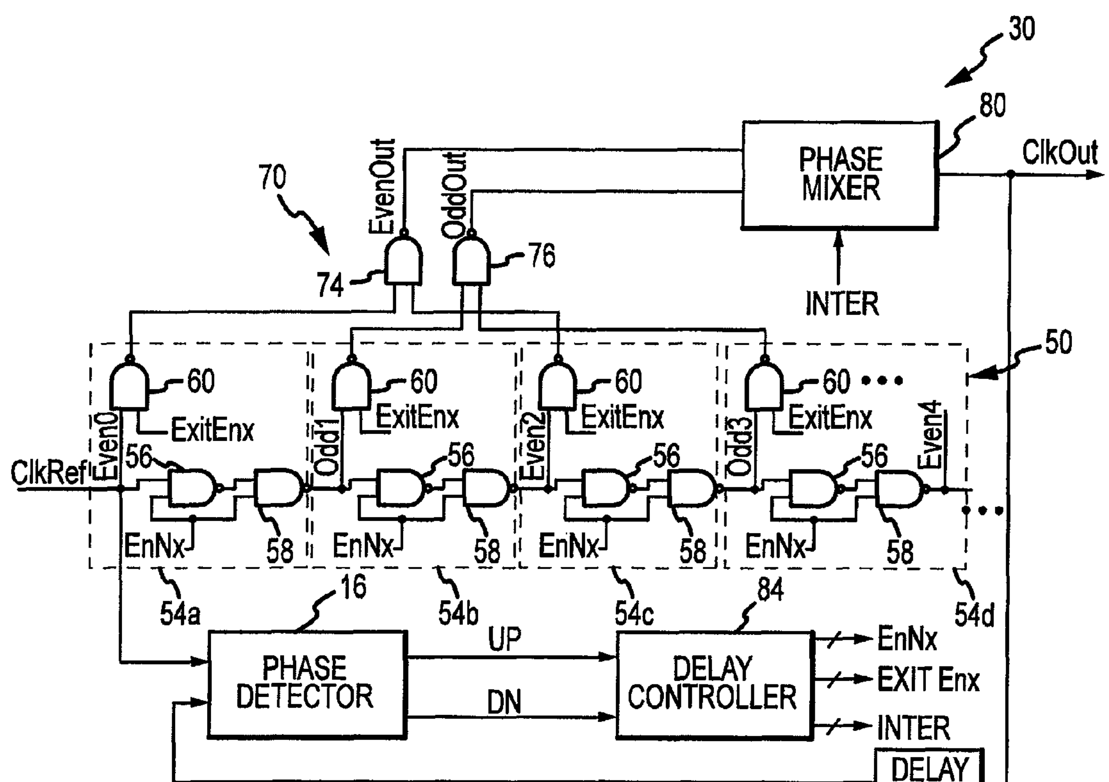
FIG. 2 is a block diagram of a conventional delay lock loop using a delay line in combination with a phase mixer to delay a reference clock signal.

A typical prior art DLL 30 using a delay line in combination with a phase mixer is shown in FIG. 2. The DLL 30 may include the same phase detector 16 and model delay 20 used in the DLL 10 of FIG. 1. A delay line 50 included in the DLL

30 includes a plurality of delay stages 54*a-d* that are coupled to each other in series. The first delay stage 54*a* receives the $CLK_{REF}$ signal. Each of the delay stages 54*a-d* includes a pair of series-coupled NAND gates 56, 58 and an exit NAND gate 60. The NAND gates 56, 58 are enabled by respective EnNx signals applied to the respective delay stages 54. When enabled, each delay stage 54 couples a clock signal applied to the input of the delay stage 54 to the output of the delay stage. Each of the delay stages 54 in the delay line 50 also receives a respective exit control signal ExitEnx, which enables the respective exit NAND gate 60 so that the gate 60 can couple a received clock signal to an input of an exit tree 70. The exit tree 70 includes a pair of NAND gates 74, 76 coupled to the exit NAND gates 60 of the delay line as shown. The exit tree 70 applies two clock signals EvenOut and OddOut, which are delayed from each other by the delay of the two NAND gates 56, 58, to an input of a phase mixer 80. The phase mixer 80 generates a feedback clock signal $CLK_{FB}$ with a phase that is interpolated between the delay between the EvenOut and OddOut signals. As with the DLL 10 of FIG. 1, the $CLK_{FB}$ signal is applied to one of the inputs of the phase detector 16. The phase detector 16 responds to a comparison between the phase of the $CLK_{REF}$ signal and the $CLK_{FB}$ signal by selectively generating UP and DN signals.

In operation, a delay controller 84 includes conventional logic used to generate delay control signals, such as EnNx signals, ExitEnx signals, and an INTER signal. For example, delay controller 84 could generate high EnNx signals that are applied to the NAND gates 56, 58 in a delay stage 54 selected in response to the UP and DN signals. The delay controller 84 also applies high EnNx signals to the respective NAND gates 56, 58 in all of the delay stages 54 upstream from the selected delay stage 54 and low EnNx signals to the respective NAND gates 56, 58 in all of the delay stages 54 downstream from the selected delay stage 54. As a result, the $CLK_{REF}$ signal is coupled through the selected delay stage 54 and all of the delay stages 54 upstream from the selected delay stage 54. However, the $CLK_{REF}$ signal is not coupled through the delay stages 54 downstream from the selected delay stage 54 because the low EnNx signals applied to these stages disable the NAND gates 56, 58 in those stages, thereby avoiding power being wasted in these stages.

The delay controller 84 also applies a high ExitEnx signal to exit NAND gate 60 in the selected delay stage 54, and it applies respective low ExitENx signals to the exit NAND gate 60 in each of the other delay stages 54. The low ExitEnx signal applied to the NAND gate 60 in each of the remaining stages causes the NAND gate 60 to output a high, which enables the NAND gates 74, 76 in the exit tree 70 so that the selected delay stage 54 can couple its input and output through the NAND gates 74, 76. Thus, only the selected delay stage 54 is enabled to output EvenOut and OddOut signals. In this manner, the delay controller 84 selects one of the delay stages 54 in the delay line 50. The delay controller 84 also generates an INTER value that causes the phase mixer 80 to interpolate between the EvenOut and OddOut signals to minimize the phase error determined by the phase detector 16. Therefore, the delay line 50 is used to apply a coarse adjustment to the delay of the $CLK_{FB}$ signal, and the phase mixer 80 is used to interpolate within the coarse delay to apply a fine adjustment to the phase of the $CLK_{OUT}$ signal.

Figure 3:
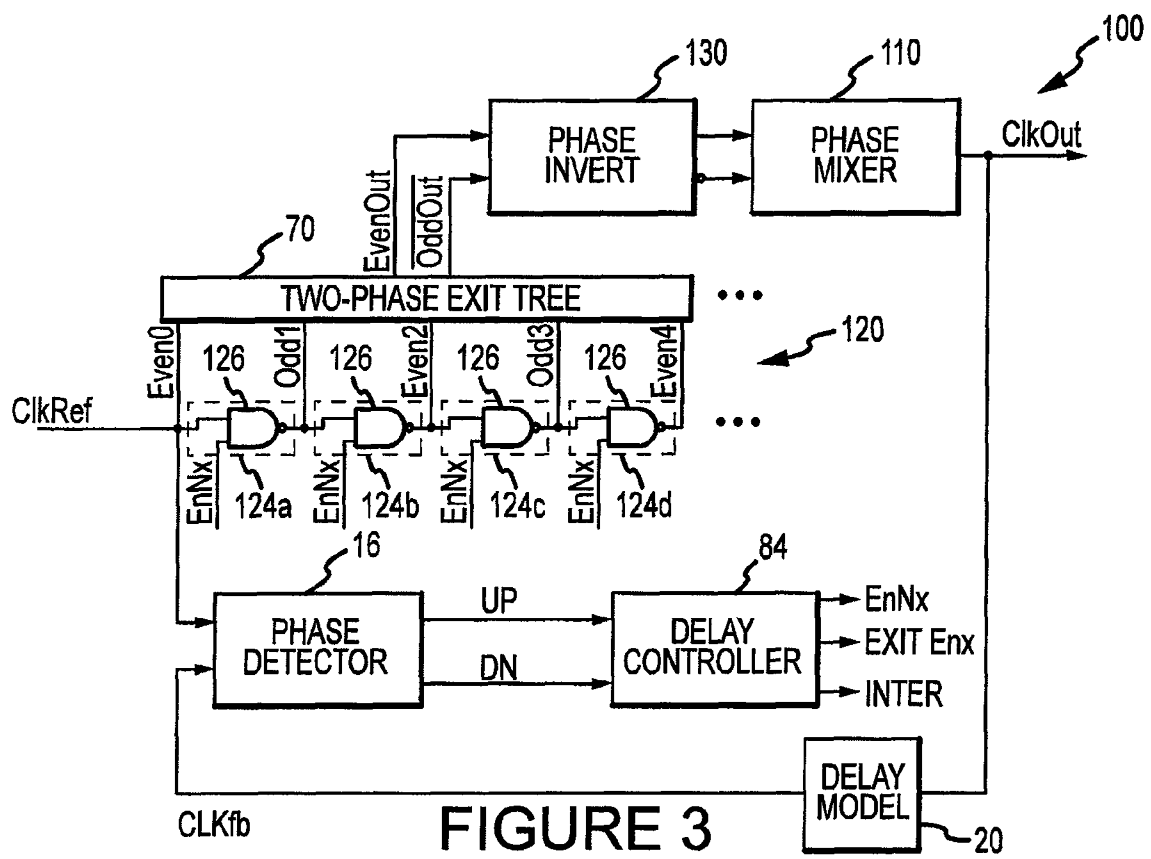
FIG. 3 is a block diagram of a delay lock loop using a delay line in combination with a phase mixer according to one embodiment of the invention.

The DLL 30 shown in FIG. 3 performs well in a variety of conventional applications, but nevertheless exhibits a variety of undesirable traits and limitations. The problems with conventional DLLs, such as the DLL30, are due primarily to the fact that each delay stage in the delay line 50 has two inverting gates 56, 58 to ensure good duty cycle control. In most inverting delay circuits, the transition from a first logic level to a second logic level is faster than the transition from the second logic level back to the first logic level. As a result, if other inverting logic elements, such as a single NAND gate and an inverter was used for each delay stage, the NAND gate might have different rise and fall times than the inverter, which would be accumulated from all of the delay stages, thereby resulting in duty cycle error, which would result in the $CLK_{FB}$ signal not having a 50% duty cycle. A deviation from a duty cycle of 50% can be particularly problematic for many applications. For example, a DQS signal is used in current memory devices to latch data on both the rising edge and the falling edge of the DQS signal. Therefore, if the $CLK_{OUT}$ signal does not have a 50% duty cycle and it is used to generate the DQS signal, the rising and falling edges of the DQS signal will generally not occur at the center of the period during which the data to be latched are valid. Such skews that can occur in the timing of the DQS signal relative to the data can thus prevent the proper data from being latched. The uses of two NAND gates 56, 58 in each stage 54 of the delay line 50 avoids the problem of duty cycle skew because the signal applied to every stage always transitions both high and low on each transition of the signal before the signal is propagated to the output of that stage.

The phase detector 16 shown in FIG. 2 has characteristics that limit the performance of the DLL 30. First, the use of two NAND gates 56, 58 or other inverting delay devices for each stage limits the minimum size of the coarse step to the delay of two NAND gates. As a result, the phase mixer 80 must interpolate over a larger range in order to provide a given size of the fine step. Second, two NAND gates 56, 58 or other inverting delay devices for each stage provide a relatively large delay which can adversely affect the ability of the phase mixer 80 to linearity adjust the delay of the delay line 50. To provide optimum performance, the delay provided by the phase mixer 80 should be a linear function of the value of an interpolation signal so that the sizes of all of the fine steps are equal to each other. Insofar as the non-linearity of a phase mixer is normally a fixed percentage of the range over which the phase mixer interpolates, the larger coarse step required to cover two NAND gates 56, 58 or other inverting delay devices results in a greater degree of non-linearity.

A DLL 100 using a delay line 120 in combination with a phase mixer 110 according to an embodiment of the invention is shown in FIG. 3. The DLL 100 may use the same delay controller 84 used in the DLL 30, and it may provide the same EnNx and ExitEnx signals. Similarly, DLL 100 may use the same exit tree 70 used in the DLL 30, and it may receive the same ExitEnx signals and output the EvenOut and OddOut* signals. Therefore, an explanation of the structure and operation of the delay controller 84 and the exit tree 70 will not be repeated. The DLL 100 differs from the DLL 30 by using a delay line 120 that is different from the delay line 50 used in the DLL 30, and it uses a phase inverter 130, which is not used in the DLL 30. Of course, a DLL according to other embodiments of the invention may have other differences from the DLL 30.

The delay line 120 includes a plurality of delay stages 124, each of which includes only a single NAND gate 126, although other embodiments may use other inverting delay (e.g., logic) devices such as NOR gates and inverters, to name two such delay devices. As a result, the size of the coarse step over which the delay of the delay line 120 is adjusted may be approximately half the size of the coarse step of the delay line 50 used in the prior art DLL 30. However, unlike the delay line 50, the output from each delay stage 124 of the delay line 120 is the delayed complement of the phase of the input to that delay stage 124. As a result, the coarse step of the delay line 120 is the difference between the phase shift through the NAND gate 126 and 180 degrees. The size of this coarse step would normally be significantly larger than the size of the coarse step provided by the delay line 50, and would thus defeat the major advantage to using a single NAND gate 126 or other inverting delay device for each stage rather than two NAND gates 56, 58 for each stage 54 as used in the delay line 50. The 180 degree phase shift could, of course, be eliminated by using a non-inverting delay device in each stage. But doing so would cause the delay devices in each of the delay stages to transition in the same direction. As a result, any difference in the time to transition between logic levels in opposite directions in each delay stage would be magnified by the number of delay stages in the delay line 120, which might result in the delay line creating substantial duty cycle skew. For example, a rising edge transition of an input signal applied to a delay line 120 containing only non-inverting delay devices would result in all of the delay devices transitioning from high-to-low. On the next transition of the input signal, i.e., from high to low, the non-inverting delay devices would all transition from low-to-high. If the low-to-high transition required more time than the high-to-low transition, the duty cycle of the input signal would be skewed by all of the delay devices, thus resulting in a significant deviation from a 50% duty cycle.

The DLL 100 allows use of the delay line 120 with a single inverting delay device in each stage by using the delay line 120 in combination with the phase inverter 130. As explained in greater detail below, the phase inverter 130 passes the EvenOut signal without inverting it and inverts the OddOut* signal to provide an OddOut signal that is no longer the complement of the EvenOut signal. The phase inverter 130 can have the same propagation delay for both the EvenOut signal and the OddOut signal so that the phase of the EvenOut signal differs from the phase of OddOut signal by only the propagation delay though one of the NAND gates 126. As a result, the size of the coarse delay over which the phase mixer 110 is only approximately half the size of the coarse step over the phase mixer 80 used in the DLL 30 must interpolate. Therefore, the linearity of the phase mixer 110 used in the DLL 100 should be significantly improved.

The delay line 120 used in the DLL 100 does invert the $CLK_{REF}$ signal over an odd number of delay stages 124 to provide either the EvenOut signal or the OddOut* signal. However, the mismatch between the number of rising edge transitions of the $CLR_{REF}$ signal compared to the number of falling edge transitions of the $CLK_{REF}$ is a single leading edge or rising edge transition. Therefore, for example, if there are 72 delay stages 124, the $CLK_{REF}$ may have a duty cycle that deviates from 50% only to the extent of a disparity in the rise time and fall time of a single delay stage 124.

Figure 4:
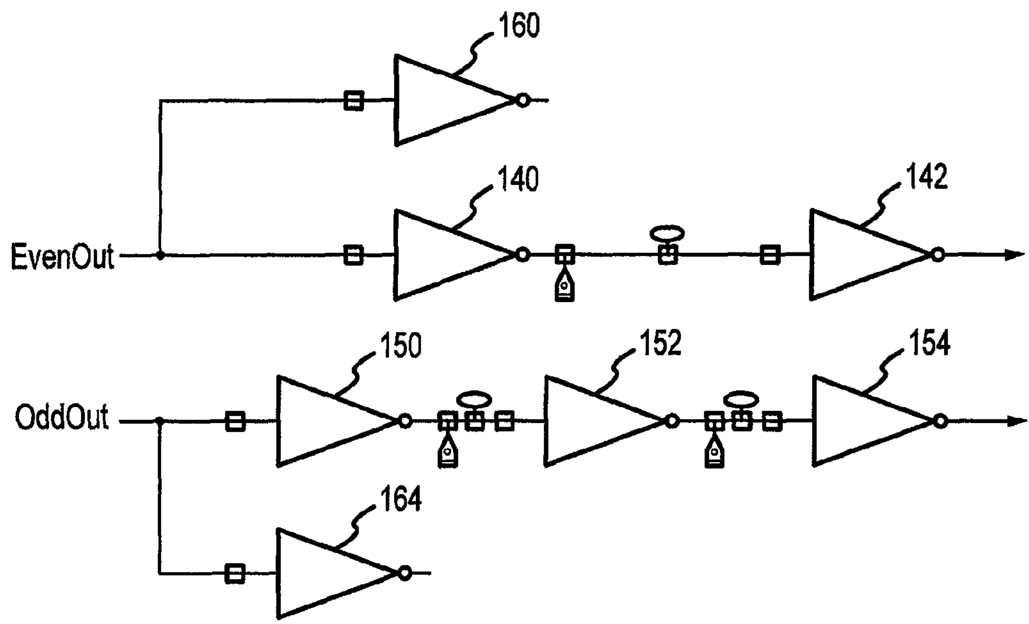
FIG. 4 is a logic diagram of an embodiment of a phase inverter that may be used in the delay lock loop of FIG. 3 or in some other delay lock loop.

A phase inverter 130 according to one embodiment of the invention is shown in FIG. 4. The phase inverter 130 includes a pair of series coupled inverters 140, 142, the first of which 140 receives the EvenOut signal and the last of which generates one of the signals applied to the phase mixer. The OddOut signal is applied to the first of a series of three inverters 150, 152, 154. The final inverter 154 has its output coupled to the other input of the phase mixer 110 (FIG. 3). Insofar as the OddOut signal is the complement of the EvenOut signal, the signals output from the phase inverter 130 have the same phase in the same manner that the phase mixer receives signals having the same phase in the prior art circuit shown in FIG. 1. It may appear that the OddOut signal would be delayed relative to the EvenOut signal by more than the delay of one delay stage because the OddOut signal is inverted by three inverters 150, 152, 154 while the EvenOut signal is inverted by only two inverters 140, 142. However, transistors (not shown) in the inverters 140, 142, 150, 152, 154 are fabricated with a size that causes the collective delay of the two inverters 140, 142 to be equal to the collective delay of the three inverters 150, 152, 154. As a result, the transistors in the inverter 140 have different electrical characteristics from the transistors in the inverter 150, and they would therefore load the respective signal lines coupled to their inputs to different degrees. To equalize the loads on each of these signal lines, an impedance compensating device, such as an extra inverter 160 having the same electrical characteristics as the inverter 150, is connected to the input of the inverter 140. Similarly, an extra inverter 164 having the same electrical characteristics as the inverter 140 is connected to the input of the inverter 150. As a result, both inputs to the phase inverter 130 have the same input impedance. However, in other embodiments of the phase inverter 130, the extra inverters 160, 164 are not used. Also, of course, other embodiments of the phase inverter 130 may use different designs.

Although the present invention has been described with reference to the disclosed embodiments, persons skilled in the art will recognize that changes may be made in form and detail without departing from the invention. For example, as explained above, the delay controller 84 includes conventional logic that selectively applies EnNx signals to the NAND gates 56, 58 in each delay stage 54 to disable the delay stages 54 downstream from a selected delay stage. However, in other embodiments of the delay line 50, the gates 56, 58 in all of the delay stages 54 my be permanently enabled, particularly if power consumption is not an issue. In such cases, rather than using a permanently enabled gate, inverters may be used in place of gates. Such modifications are well within the skill of those ordinarily skilled in the art. Accordingly, the invention is not limited except as by the appended claims.

We claim:

1. A method of delaying a reference clock signal, comprising:

generating a plurality of delayed signals each of which is delayed relative to another one of the delayed signals by a coarse delay interval, the delayed signals having delays differing from each other by one coarse delay interval being inverted from each other;

selecting one of the delayed signals and applying the selected delayed signal to a first output;

inverting another one of the delayed signals having a delay differing from the delay of the selected delayed signal by a single coarse delay interval; and applying the inverted delayed signal to a second output.

2. The method of claim 1 wherein the selected delayed signal is applied to the first output with a propagation delay that is substantially equal to a propagation delay at which the other one of the delayed signals is applied to the second output.

3. The method of claim 1 wherein the delayed signals are generated by respective series coupled inverting delay devices, and wherein the method further comprises disabling inverting delay devices downstream from the inverting delay device generating the selected delayed signal.

4. A method of synchronizing an output clock signal to a reference clock signal, comprising:

sequentially inverting and delaying the reference clock signal by a sequence of coarse delays so that a plurality of delayed signals are generated each of which is inverted and delayed from a prior delayed signal by one coarse delay;

selecting two of the delayed signals, the selected delayed signals having respective delays that differ from each other by one coarse delay;

inverting one of the selected delayed signals without inverting the other of the selected signals;

using the selected delayed signals and an interpolation value to interpolate between the delay of the inverted delayed signal and the delay of the other one of the delayed signal to provide an output clock signal; and comparing the timing of the reference clock signal to the timing of the output clock signal to determine the selected delayed signals and the interpolation value.

5. The method of claim 4 wherein the delay of the inverted delayed signal differs from the delay of the other of the delayed signals by substantially one coarse delay.

6. The method of claim 4 wherein the delayed signals are generated by respective series coupled inverting delay devices, and wherein the method further comprises disabling inverting delay devices downstream from the inverting delay device generating the selected delayed signal.

7. The method of claim 1, further comprising:

phase mixing the signals applied to the first and second outputs to provide an output clock signal.

8. The method of claim 7 wherein phase mixing the signals applied to the first and second outputs comprises:

interpolating between a delay between the signals applied to the first and second outputs.

9. The method of claim 1 wherein applying the selected delayed signal to a first output comprises inverting the selected delayed signal twice before applying the selected delayed signal, and wherein inverting another one of the delayed signals comprises inverting the selected delayed signal three times.

10. The method of claim 9 wherein a propagation delay for inverting the selected delayed signal once is longer than a propagation delay for inverting the another one of the delayed signal once.

11. The method of claim 9, further comprising balancing loads for inverting the selected delayed signal twice and the inverting the another one of the delayed signals.

12. The method of claim 1 wherein one coarse delay interval is equal to a propagation delay of a single inverting delay device.

13. The method of claim 4 wherein comparing the timing of the reference clock signal to the timing of the output signal comprises:

delaying the output signal by a model delay to provide a feedback signal; and determining a phase difference between the reference clock signal and the feedback signal, wherein the selected delayed signals and the interpolation value are determined based at least in part on the phase difference.

14. The method of claim 12 wherein sequentially inverting and delaying the reference clock signal comprises:

providing the reference clock signal to a delay line having a plurality of delay stages, wherein each delay stage has a single inverting delay device.

15. The method of claim 14 wherein the single inverting delay device comprises a NAND gate.

16. The method of claim 4 wherein inverting one of the selected delayed signals without inverting the other of the selected signals comprises propagating the one of the selected delayed signals through an odd number of inverters and propagating the other of the selected signals through an even number of inverters, at least one of the even number of inverters has different electrical characteristics from at least one of the odd number of inverters.

17. The method of claim 16 wherein a propagation delay for at least one of the even number of inverters is shorter than a propagation delay for at least one of the odd number of inverters.

18. The method of claim 4 wherein inverting one of the selected delayed signals without inverting the other of the selected signals comprises propagating the one of the selected delayed signals through an inverting delay and propagating the other of the selected signals through a non-inverting delay, the propagation delay for the inverting and non-inverting delays are substantially equal.

19. The method of claim 4 wherein using the selected delayed signals and an interpolation value to interpolate between the delay of the inverted delayed signal and the delay of the other one of the delayed signal adds a fine delay to provide the output clock signal.

20. The method of claim 4 wherein one of the two selected delayed signals is provided by inverting the other one of the two selected delayed signals.

* * * * *

UNITED STATES PATENT AND TRADEMARK OFFICE

CERTIFICATE OF CORRECTION

PATENT NO. : 8,149,034 B2
APPLICATION NO. : 12/986973
DATED : April 3, 2012
INVENTOR(S) : Tyler Gomm It is certified that error appears in the above-identified patent and that said Letters Patent is hereby corrected as shown below:

In column 8, line 11, in Claim 14, delete “claim 12” and insert -- claim 4 --, therefor.

Signed and Sealed this
Twenty-ninth Day of May, 2012

David J. Kappos
*Director of the United States Patent and Trademark Office*